United States Patent
Iino

Patent Number: 6,056,818
Date of Patent: May 2, 2000

[54] METHOD OF MANUFACTURING A SILICON MONOCRYSTAL, AND METHOD OF HOLDING THE SAME

[75] Inventor: Eiichi Iino, Gunma-ken, Japan

[73] Assignee: Shin-Etsu Handotai Co., Ltd., Tokyo, Japan

[21] Appl. No.: 09/096,093

[22] Filed: Jun. 11, 1998

[30] Foreign Application Priority Data

Jun. 23, 1997 [JP] Japan .................................. 9-181720

[51] Int. Cl.$^7$ ............................................... C30B 15/32
[52] U.S. Cl. ........................... 117/13; 117/208; 117/911
[58] Field of Search .......................... 117/13, 200, 208, 117/218, 900, 911

[56] References Cited

U.S. PATENT DOCUMENTS 5,911,822  6/1999  Abe et al. .................................. 117/13

FOREIGN PATENT DOCUMENTS

| 0286133 | 10/1988 | European Pat. Off. . | |
|---|---|---|---|
| 0449260 | 10/1991 | European Pat. Off. . | |
| 0854211 | 7/1998 | European Pat. Off. . | |
| 62-288191 | 12/1987 | Japan . | |
| 62-2881912 | 12/1987 | Japan .............................. | C30B 15/00 |
| 63-252991 | 10/1988 | Japan .............................. | C30B 15/00 |
| 3285893 | 12/1991 | Japan .............................. | C30B 15/32 |
| 3295893 | 12/1991 | Japan .............................. | C30B 15/30 |
| 5139880 | 6/1993 | Japan . | |

*Primary Examiner*—Felisa Hiteshen
*Attorney, Agent, or Firm*—Loeb & Loeb, LLP

[57] ABSTRACT

There is disclosed a method of manufacturing a silicon monocrystal in accordance with the Czochralski method in which a seed crystal is brought into contact with silicon melt and is then slowly pulled while being rotated in order to grow a silicon monocrystalline ingot below the seed crystal. In the method, there is used a seed crystal whose a tip end to be brought into contact with the silicon melt has a sharp-pointed shape or a truncation thereof. The tip end of the seed crystal is gently brought into contact with the silicon melt, and the seed crystal is then lowered at a low speed in order to melt the tip end portion of the seed crystal until the thickness of the tip portion increases to a desired value. Subsequently, the seed crystal is pulled slowly in order to grow a silicon monocrystalline ingot having a desired diameter without performance of a necking operation. During the growth of the silicon monocrystalline ingot, a part of the crystal is mechanically held. The method completely prevents falling of a monocrystalline ingot being grown which would otherwise occur due to the increased diameter and weight of the ingot.

3 Claims, 3 Drawing Sheets

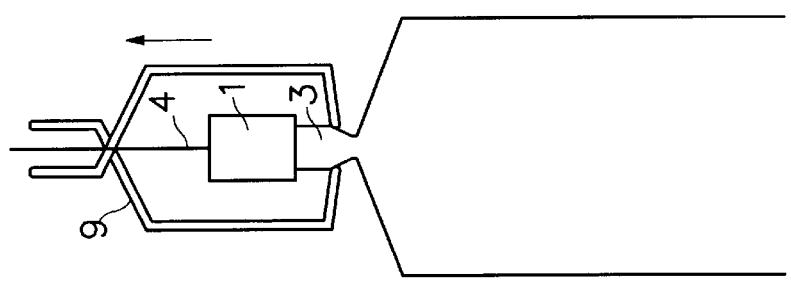
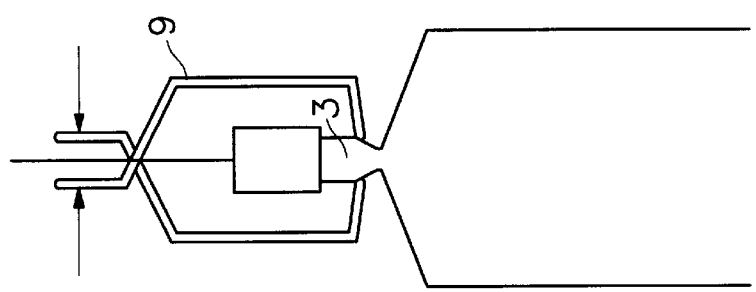
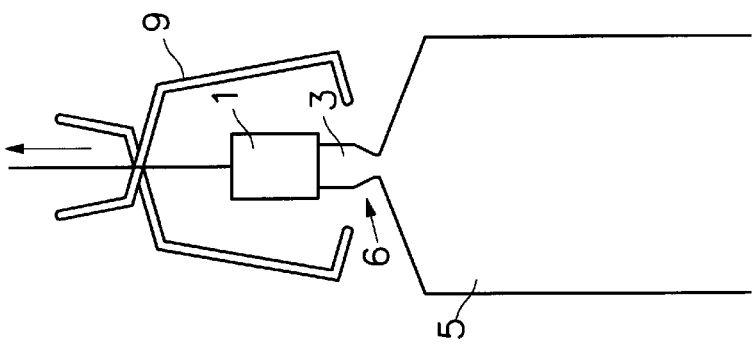
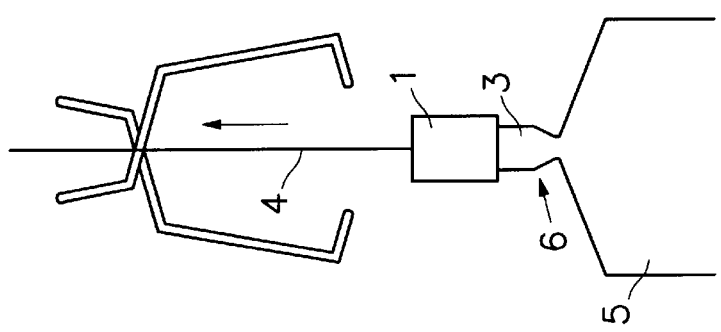
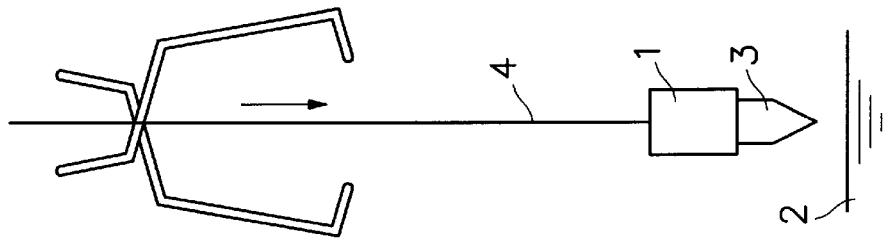

METHOD OF MANUFACTURING A SILICON MONOCRYSTAL, AND METHOD OF HOLDING THE SAME

BACKGROUND OF THE INVENTION

1. Field of the Invention

The present invention relates to a method of manufacturing a silicon monocrystal in accordance with a Czochralski (CZ) method in which there are combined a technique of growing a silicon monocrystal without performance of a so-called necking operation and a technique of mechanically holding a part of the crystal during growth thereof.

2. Description of the Related Art

The Czochralski method has been known as a method of manufacturing a semiconductor material such as silicon. As shown in FIG. 3A, according to this method, a seed crystal 52 held by a seed crystal holder 51 is brought into contact with the surface of material melt 54 contained in a crucible 53. The seed crystal 52 is then pulled while being rotated. At this time, the pulling rate and the temperature are controlled such that a neck 55 is formed below the seed crystal 52. This operation is called necking. Subsequently, there is formed a body 56 which is a monocrystal having a large diameter.

The formation of the neck 55 permits elimination of dislocations from the body 56 of the monocrystal formed below the neck 55. In recent years the weight of crystals has increased due to an increase in the diameter of monocrystals and an improvement of manufacturing efficiency, and, pulling of crystals having a weight of even 100 kg or more is now performed. In such a case, the strength of the seed crystal 52 and the neck 55 tends to become insufficient. If the crystal that is being grown falls as a result of fracture of the neck during the course of the pulling of the crystal, a serious accident may occur. In order to prevent such an accident, as shown in FIG. 3B, there has been adopted a method and apparatus which enable mechanical holding of a part of the crystal during growth of the crystal.

In this apparatus, a stepped engagement portion 57 consisting of an increased-diameter portion and a reduced-diameter portion is formed between the neck 55 and the straight body portion 56, and the crystal is pulled while crystal holding jigs 58, 58 hold the stepped engagement portion 57. Examples of such a technique are described in, e.g., Japanese patent Application Laid-open (kokai) Nos. 62-288191, 63-252991, 3-285893, and 3-295893. For instance, in the apparatus disclosed in Japanese patent Application Laid-open No. 3-285893, a stepped engagement portion is formed while a seed crystal is pulled, and when the stepped engagement portion reaches a position corresponding to gripping levers disposed at a predetermined height, the gripping levers grip and pull the stepped engagement portion.

Further, in order to solve the problems, the applicant of the present invention has successfully developed a method of manufacturing a silicon monocrystal, which method can make a growing crystal monocrystalline without performance of necking operation for forming a neck, which would cause a problem in terms of strength, thereby enabling a heavy silicon monocrystal having a large diameter and length to be pulled quite simply while eliminating the necessity of using a complicated apparatus such as a crystal holding mechanism. The applicant of the present invention has also developed a seed crystal used in the method (Japanese patent Application No. 9-17687).

In this method, there is used as a seed crystal a crystal whose tip end portion to be brought into contact with silicon melt has a sharp-pointed shape or a truncation thereof, as shown in FIGS. 2A to 2D. More specifically, the tip end portion of the seed crystal has a tapered shape whose diameter decreases toward the tip end, such as a circular conical shape 7 or a pyramidal shape 8.

A silicon monocrystalline ingot can be grown without formation of a neck, if such a seed crystal is used and pulling operation is performed in such a manner that after the tip end of the seed crystal is gently brought into contact with the silicon melt, the seed crystal is lowered at a slow speed in order to melt the tip end portion of the seed crystal until the thickness of the tip portion increases to a desired value; and subsequently, the seed crystal is pulled slowly in order to grow a silicon monocrystalline ingot having a desired diameter without performance of a necking operation.

Since the above-described method does not include a necking operation, the method can completely solve the problems about fall of the crystal in relation to formation of a neck. Therefore, the above-described method is considerably excellent.

Meanwhile, the above-mentioned method of mechanically holding a part of a crystal being grown has the problem that the part of the crystal cannot be held mechanically until the crystal is grown to a certain degree or length, but in order to prevent fall of the crystal as a result of fracture of the neck, the crystal must be held as early as possible before the crystal is grown to become too heavy.

In order to satisfy the above requirement, the crystal may be held immediately after the engagement stepped portion of the crystal to be held is formed during the growth of the crystal. However, in this case, the crystal must be held right above the material melt, so that a holding device is directly exposed to the high-temperature material melt (the melting temperature of silicon is 1400° C. or higher), thereby resulting in faulty operations or alteration of the quality of the material of the holding device. Further, the material melt may be contaminated by impurities.

If the crystal being grown is subjected to mechanical stress while remaining at elevated temperature, plastic deformation may arise in the crystal, which in turn would cause slip dislocation in the crystal being grown. If such slip dislocation is generated in the crystal being grown, the mechanical strength of the portion of the crystal where the slip dislocation is generated decreases, thereby imposing a risk of fracture for that portion when the crystal has grown to become heavy.

Further, if the crystal is grown to be equal to or greater than a certain weight, the seed crystal or the neck may not bear the weight and hence may fracture. For this reason, it is necessary to grow the crystal to a weight less than the critical weight of the crystal being grown or to mechanically hold the crystal before the weight of the crystal has reached the critical weight.

In growth of a recent large-diameter crystal of, for example, 8 inches or more, the weight of the crystal reaches the critical weight after the crystal is grown to only a slight length. Especially, for the case of crystals having a diameter of 12 to 16 inches which have recently been developed, 1 cm growth of a crystal causes an increase in weight of 1.6 kg to 3 kg. An amount of weight of a crystal ingot becomes 200–300 kg. Therefore, the crystal being grown must be mechanically held as early as possible. In contrast, during the growth of a crystal having a large diameter, a high-temperature region inevitably extends over a wide area of the crystal. Therefore, before the crystal is grown to a certain extent, the temperature of the portion of the crystal to be held does not decrease to a temperature at which plastic deformation does not occur.

Also, in the method in which a part of a crystal is mechanically held, a stepped engagement portion must be formed, resulting in lowered productivity and decreased yield. In addition, forming the stepped engagement portion into a desired shape is difficult, and the formed engagement portion does not necessarily have a shape that can be held.

On the other hand, the CZ method without performance of a necking operation does not cause the above-mentioned problems and therefore can completely solve various problems in relation to formation of the stepped engagement portion.

In recent years, the diameter of monocrystals has been increased due to increased degree of integration of devices, and thus the weight of a crystal to be pulled has increased more than expected. Because of this trend, in addition to a problem in relation to formation of a neck through a necking operation, there have arisen problems of fracture of a seed crystal at a portion where the seed crystal is held by a seed crystal holder, breakage of the seed crystal holder itself, breakage of wire, and the like.

SUMMARY OF THE INVENTION

The present invention has been conceived in view of the foregoing drawbacks in the prior art. An object of the present invention is to provide a method of manufacturing a silicon monocrystalline ingot in accordance with the CZ method, which method completely eliminates a fear of fall of the monocrystalline ingot during growth thereof, which would otherwise occur due to the increased diameter and weight of the ingot.

To achieve the foregoing objects, the invention provides an improved method of manufacturing a silicon monocrystal in accordance with the Czochralski method in which a seed crystal is brought into contact with silicon melt and is then slowly pulled while being rotated in order to grow a silicon monocrystalline ingot below the seed crystal. In the method, there is used a seed crystal whose tip end to be brought into contact with the silicon melt has a sharp-pointed shape or a truncation thereof. The tip end of the seed crystal is brought into contact with the silicon melt, and the seed crystal is lowered at a slow speed in order to melt the tip end portion of the seed crystal until the thickness of the tip portion increases to a desired value. Subsequently, the seed crystal is pulled upwardly slowly in order to grow a silicon monocrystalline ingot having a desired diameter without performance of a necking operation. During the growth of the silicon monocrystalline ingot, a part of the crystal is mechanically held.

Since a technique of manufacturing a silicon monocrystal without performance of a necking operation is combined with a technique of mechanically holding a part of the crystal being grown in order to pull the crystal, the disadvantages of the two techniques are canceled out while the advantages thereof are exerted. As a result, there can be completely solved the problem of crystal fall which would otherwise occur due to the increased weight of the monocrystalline ingot.

That is, since a necking operation is not performed, the problem in relation to strength of a neck is solved, and the crystal is not required to be mechanically held in the early stage of the growth of the crystal. In addition, various problems such as fracture of a seed crystal at a portion where the seed crystal is held by a seed crystal holder, breakage of the seed crystal holder itself, and breakage of a wire can be solved if the crystal being grown is mechanically held after the crystal is grown to such a length that the temperature of the portion of the crystal to be held has decreased sufficiently.

Preferably, mechanical holding of the part of the crystal is performed though holding a tapered tip end portion of the seed crystal having a sharp-pointed shape or a truncation thereof.

In this case, since the tapered tip end portion of the seed crystal having a sharp-pointed shape or a truncation thereof can be mechanically held, a stepped engagement portion does not have to be formed, so that the pulling operation can be made considerably simple. Further, since the tapered tip end portion is accurately formed into a desired shape in advance, the monocrystal can be held reliably.

The present invention also provides an improved method of mechanically holding a part of a monocrystal during growth of a silicon monocrystal in accordance with the Czochralski method in which a seed crystal is brought into contact with silicon melt and is then slowly pulled while being rotated in order to grow a silicon monocrystalline ingot below the seed crystal. In the crystal holding method, there is used a seed crystal whose tip end to be brought into contact with the silicon melt has a sharp-pointed shape or a truncation thereof. The tip end of the seed crystal is brought into contact with the silicon melt, and the seed crystal is lowered at a slow speed in order to melt the tip end portion of the seed crystal until the thickness of the tip portion increases to a desired value. Subsequently, the seed crystal is pulled upwardly slowly in order to grow a silicon monocrystalline ingot having a desired diameter. During the growth of the monocrystalline ingot, a tapered tip end portion of the seed crystal having a sharp-pointed shape or a truncation thereof is mechanically held.

In the method of holding a crystal of the present invention, a crystal being grown is mechanically held in a simple and reliable manner. Therefore, the method is useful in holding and pulling a heavy monocrystal regardless of whether the pulling operation is performed with or without performance of a necking operation.

As mentioned above, in the present invention, since the technique of manufacturing a silicon monocrystal in accordance with the CZ method without performance of a necking operation is combined with the technique of mechanically holding a part of the crystal in order to pull the crystal, there can be eliminated the danger of fall of a monocrystalline ingot being grown, which would otherwise occur due to the increased diameter and weight of the ingot to be manufactured.

That is, since a necking operation is not performed, the present invention thoroughly solves the problem in relation to formation of a neck. Further, through mechanical holding of a crystal, the present invention solves various other problems; i.e. fracture of a seed crystal at a portion where the seed crystal is held by a seed crystal holder, breakage of the seed crystal holder itself, breakage of a wire, and the like.

Also, since the crystal is held at a portion having a sufficiently decreased temperature, there do not occur plastic deformation of a crystal ingot, slip dislocation, and malfunction of a crystal holding jig, which would otherwise occur due to high temperatures. Moreover, since a stepped engagement portion does not have to be formed, a crystal ingot being grown is held simply and reliably.

BRIEF DESCRIPTION OF THE DRAWINGS

FIGS. 1A–1E are explanatory views showing a method according to the present invention in the sequence of the steps of the method;

FIGS. 2A–2D are perspective views of seed crystals used in the present invention, wherein FIG. 2A shows a cylindrical columnar seed crystal having a conical tip end, FIG. 2B shows a rectangular columnar seed crystal having a pyramidal tip end, FIG. 2C shows a seed crystal having a horizontally truncated conical tip end, and FIG. 2D shows a seed crystal having an obliquely truncated conical tip end.

DESCRIPTION OF THE INVENTION AND EMBODIMENT

The present invention and embodiments thereof will now be described. However, the invention is not limited thereto.

First, will briefly be described a method of manufacturing a silicon monocrystal in accordance with the Czochralski method without performance of a necking operation.

In the manufacturing method of the present invention, there is used a seed crystal whose tip end to be brought into contact with the silicon melt has a sharp-pointed shape or a truncation thereof. The tip end of the seed crystal is gently brought into contact with the silicon melt, and the seed crystal is then lowered at a slow speed in order to melt the tip end portion of the seed crystal until the thickness of the tip portion increases to a desired value. Subsequently, the seed crystal is pulled upwardly slowly in order to grow a silicon monocrystalline ingot having a desired diameter without performance of a necking operation.

In this method, even when a seed crystal is brought into contact with silicon melt and is melted from a state in which it is separated from the silicon melt, thermal shock does not act on the seed crystal upon contact with the silicon melt, due to a small area and a small heat capacity of the portion to first come into contact with the silicon melt. Further, since the contact area increases gradually due to a subsequent slow lowering of the seed crystal, no steep temperature gradient is formed within the seed crystal during the melting.

Accordingly, when a silicon monocrystalline ingot is manufactured in accordance with the CZ method, the silicon monocrystalline ingot can be grown without performance of a necking operation, so long as a seed crystal having a sharp-pointed tip or a truncation thereof, either of which has a small contact area, is used, and so long as the pulling operation is performed such that the tip end of the seed crystal is gently brought into contact with the silicon melt; and the seed crystal is lowered slowly such that the tip end of the seed crystal is melted to have a desired diameter that can sustain the final weight of a heavy monocystalline ingot and the seed crystal is then pulled upwardly slowly in order to grow the monocrystalline ingot to a desired diameter.

Figure 2A:
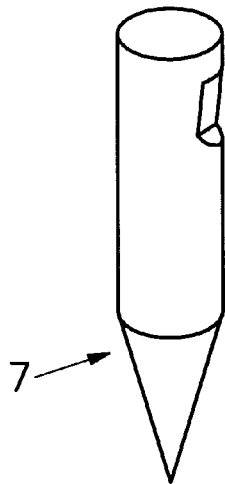
Figure 2B:
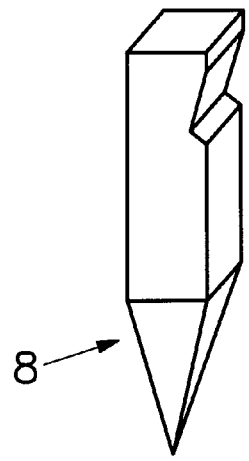
Figure 2C:
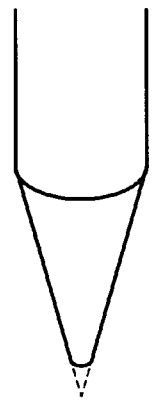
Figure 2D:
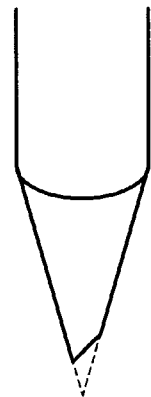
Figure 3A:
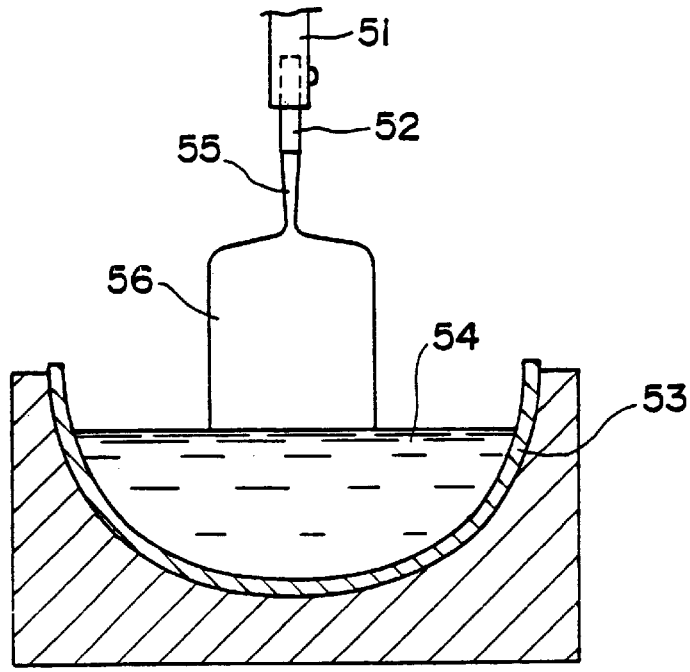
FIGS. 3A and 3B are explanatory views showing a conventional Czochralski method and a conventional method of holding a crystal, respectively.
Figure 3B:
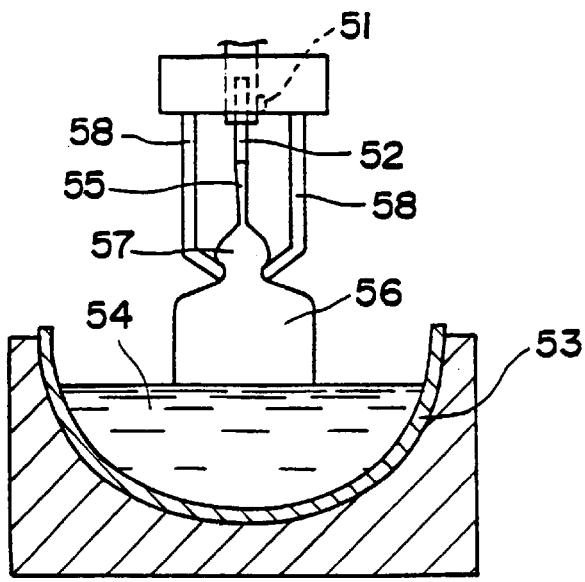

In the above-mentioned CZ method without performance of a necking operation, the tip end of a seed crystal must be formed into a sharp-pointed shape or a truncation thereof, as shown in FIGS. 2A–2D. If the seed crystal has such a shape, the tip end of the seed crystal has a reduced initial contact area and a reduced heat capacity, so that even when the tip end of the seed crystal comes into contact with silicon melt, thermal shock or a steep temperature gradient is not generated within the seed crystal, and therefore no slip dislocation is generated.

When the seed crystal is then lowered slowly and the tip end of the seed crystal is melted to have a desired diameter, the contact area between the immersed portion of the seed crystal and the melt gradually increases. Thus, the seed crystal can be melted without generation of a steep temperature gradient, so that no slip dislocation is generated within the seed crystal during the melting operation.

Since the above-mentioned CZ method without performance of a necking operation does not employ a neck portion, the problem in relation to strength of this portion is thoroughly solved. However, when a heavy monocrystal is pulled, in addition to the problem in relation to the strength of a neck, there may arise problems of fracture of a seed crystal at a portion where the seed crystal is held by a seed crystal holder, breakage of the seed crystal holder itself, breakage of a wire, and the like. In order to solve these problems, in the present invention, a monocrystal is mechanically held during growth thereof.

Next, the method of the present invention will specifically be described with reference to the drawings.

FIGS. 1A–1E are explanatory views showing the method of the present invention in the sequence of the steps of the method.

First, as shown in FIG. 1A, a seed crystal 3 having a sharp-pointed tip end to be brought into contact with silicon melt 2 is attached to a seed crystal holder 1 supported by means of a wire 4. The wire 4 is then lowered and stopped for a while at a position immediately above the silicon melt 2 in order to increase the temperature of the seed crystal 3.

Next, the wire 4 is slowly lowered so that the sharp-pointed tip end of the seed crystal 3 is gently brought into contact with the silicon melt 2. Further, the seed crystal 3 is lowered at slow speed, and is melted until the tip end thereof has a desired thickness which enables pulling of a heavy monocrystal.

After the tip end of the seed crystal 3 has been melted to have the desired thickness, the seed crystal 3 is slowly pulled, without performance of a necking operation, in order to increase the diameter of the crystal to a desired value. Subsequently, the straight body portion 5 of the crystal is formed to grow a silicone monocrystalline ingot (FIG. 1B).

The growth of the straight body portion 5 of the monocrystal is continued until a tapered portion 6 of the seed crystal 3 has reached a height corresponding to that of the tip ends (lower ends) of a crystal holding jig 9 (FIG. 1c).

In this case, prior to the holding, the crystal holding jig 9 is situated at a height where temperature is sufficiently low in order to prevent malfunction of the jig and degradation of its members due to high temperature, as well as to prevent occurrence of plastic deformation or slip dislocation which would otherwise occur due to stress applied to the crystal.

If the monocrystalline ingot being grown has a large diameter, the ingot already has a relatively large weight at this stage. However, since a necking operation is not performed, there is no fear that the neck fractures as in the conventional method. At this stage, the crystal does not grow so heavy as to cause concerns about fracture of the contact portion between the seed crystal 3 and the seed crystal holder 1, breakage of the seed crystal holder 1, breakage of the wire 4, and the like.

When the tapered portion 6 of the seed crystal 3 reaches a predetermined position, the tapered portion 6 of the seed crystal 3 is mechanically held from both sides by means of the crystal holding jig 9 (FIG. 1D). After completion of mechanical holding of the monocrystalline ingot, the crystal holding jig 9 is slowly pulled upwardly in such a manner that the weight of the ingot acts on the jig. Subsequently, the pulling of the jig is continued in order to continue the growth of the monocrystal.

As the growth of the monocrystal is continued, the weight of the monocrystalline ingot increases further. In this stage, the weight of the crystal ingot acts on the crystal holding jig 9 through the tapered portion of the seed crystal 3. In other words, unlike in the case of the conventional method, no great weight acts on the contact portion between the seed crystal 3 and the seed crystal holder 1, the seed crystal holder 1, or the wire 4, resulting in no fracture or breakage thereof.

The present invention is not limited to the above-described embodiment. The above-described embodiment is a mere example, and those having the substantially same structure as that described in the appended claims and providing the similar action and effects are included in the scope of the present invention.

For example, the present invention can be applied not only to the ordinary CZ method but also to the MCZ method (Magnetic field applied Czochralski crystal growth method) in which a magnetic field is applied to silicon melt when a silicon monocrystal is pulled. Therefore, the term "Czochralski method" or "CZ method" encompasses not only the ordinary CZ method but also the MCZ method.

Also, the crystal holding jig is not limited to the above-mentioned jig. Therefore, no particular limitation is imposed on the jig's shape, mechanism, and method of holding, so long as the jig mechanically holds a part of a crystal.

In the above-described embodiment, a description is provided while focusing on the case where the jig holds the tapered portion of a seed crystal. However, holding the tapered portion of a seed crystal is not an essential requirement of the present invention, and if needed a stepped engagement portion which is formed in advance may be held. Alternatively, the straight body portion of a monocrystalline ingot may be held.

Also, in the present invention, the term "tapered portion of a seed crystal" shall not be strictly construed to mean a portion whose diameter decreases towards the tip end of a seed crystal. The term "tapered portion" encompasses any portion whose thickness decreases towards the lower tip end of a seed crystal and which has a shape that can be held by means of the crystal holding jig.

What is claimed is:

1. A method of manufacturing a silicon monocrystal in accordance with the Czochralski method in which a seed crystal is brought into contact with silicon melt and is then slowly pulled while being rotated in order to grow a silicon monocrystalline ingot below the seed crystal, the method comprising the steps of:

providing a seed crystal having a tip end to be brought into contact with the silicon melt, the tip end having a sharp-pointed shape or a truncation thereof;

gently bringing the tip end of the seed crystal into contact with the silicon melt and then lowering the seed crystal at a low speed in order to melt the tip end portion of the seed crystal until the thickness of the tip portion increases to a desired value; and pulling upwardly the seed crystal slowly in order to grow a silicon monocrystalline ingot having a desired diameter without performance of a necking operation, wherein a part of the crystal is mechanically held during the growth of the silicon monocrystalline ingot.

2. A method of manufacturing a silicon monocrystal according to claim 1, wherein mechanical holding of the part of the crystal is performed though holding a tapered tip end portion of the seed crystal having a sharp-pointed shape or a truncation thereof.

3. A method of mechanically holding a part of a monocrystal during growth of a silicon monocrystal in accordance with the Czochralski method in which a seed crystal is brought into contact with silicon melt and is then slowly pulled while being rotated in order to grow a silicon monocrystalline ingot below the seed crystal, the holding method comprising the steps of:

providing a seed crystal having a tip end to be brought into contact with the silicon melt, the tip end having a sharp-pointed shape or a truncation thereof;

gently bringing the tip end of the seed crystal into contact with the silicon melt and then lowering the seed crystal at a low speed in order to melt the tip end portion of the seed crystal until the thickness of the tip portion increases to a desired value; and subsequently, pulling upwardly the seed crystal slowly in order to grow a silicon monocrystalline ingot having a desired diameter, wherein during the growth of the silicon monocrystalline ingot, a tapered tip end portion of the seed crystal having a sharp-pointed shape or a truncation thereof is mechanically held.

* * * * *